(12) United States Patent
Yantchev

(10) Patent No.: US 12,132,464 B2
(45) Date of Patent: *Oct. 29, 2024

(54) FILTER USING TRANSVERSELY-EXCITED FILM BULK ACOUSTIC RESONATORS WITH DIVIDED FREQUENCY-SETTING DIELECTRIC LAYERS

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 244 days.

This patent is subject to a terminal disclaimer.

(21) Appl. No.: 17/743,328

(22) Filed: May 12, 2022

(65) Prior Publication Data

US 2022/0278666 A1 Sep. 1, 2022

Related U.S. Application Data

(63) Continuation of application No. 17/081,717, filed on Oct. 27, 2020, now Pat. No. 11,374,549, which is a
(Continued)

(51) Int. Cl.
*H03H 9/02* (2006.01)
*H03H 3/04* (2006.01)
(Continued)

(52) U.S. Cl.
CPC .......... *H03H 9/02228* (2013.01); *H03H 3/04* (2013.01); *H03H 9/02031* (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 7,042,132 B2   5/2006   Bauer et al.
7,939,987 B1   5/2011   Solal et al.
(Continued)

FOREIGN PATENT DOCUMENTS

CN   113765495 A   12/2021
JP   S5362964 A    6/1978
(Continued)

OTHER PUBLICATIONS

Yang et al., "5 GHz Lithium Niobate MEMS Resonators with High FOM of 153," MEMS 2017, Jan. 22-26, 2017, pp. 942-945.
(Continued)

*Primary Examiner* — Hafizur Rahman
(74) *Attorney, Agent, or Firm* — ARENTFOX SCHIFF LLP

(57) ABSTRACT

Acoustic filters and methods of fabrication are disclosed. A filter device includes a substrate and a single-crystal piezoelectric plate, a back surface of the piezoelectric plate attached to a surface of the substrate. The filter device includes a plurality of acoustic resonators including one or more shunt resonators and one or more series resonators. Each of the plurality of acoustic resonators includes an interdigital transducer (IDT) formed on the front surface of the piezoelectric plate, interleaved fingers of the IDT disposed on a respective diaphragm formed by a respective portion of the piezoelectric plate that spans a respective cavity in the substrate. A divided frequency setting layer is formed on at least some of the one or more shunt resonators but not on the one or more series resonators.

17 Claims, 13 Drawing Sheets

Related U.S. Application Data continuation-in-part of application No. 16/920,173, filed on Jul. 2, 2020, now Pat. No. 11,139,794, which is a continuation of application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 63/067,329, filed on Aug. 19, 2020, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
| | | |
|---|---|---|
| *H03H 9/13* | (2006.01) | |
| *H03H 9/17* | (2006.01) | |
| *H03H 9/56* | (2006.01) | |
| *H03H 3/02* | (2006.01) | |

(52) U.S. Cl.
CPC ............ *H03H 9/132* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01); *H03H 2003/0442* (2013.01)

(58) Field of Classification Search
CPC ........ H03H 9/176; H03H 9/562; H03H 9/564; H03H 9/568; H03H 2003/023; H03H 2003/0442
USPC .......................................................... 333/193
See application file for complete search history.

(56) References Cited

U.S. PATENT DOCUMENTS

| | | | |
|---|---|---|---|
| 7,965,015 | B2 | 6/2011 | Tai et al. |
| 9,112,134 | B2 | 8/2015 | Takahashi |
| 9,240,768 | B2 | 1/2016 | Nishihara et al. |
| 9,525,398 | B1 | 12/2016 | Olsson et al. |
| 9,564,873 | B2 | 2/2017 | Kadota |
| 9,748,923 | B2 | 8/2017 | Kando et al. |
| 10,187,039 | B2 | 1/2019 | Komatsu et al. |
| 10,284,176 | B1 | 5/2019 | Solal |
| 10,819,309 | B1 | 10/2020 | Turner et al. |
| 10,868,510 | B2 | 12/2020 | Yantchev |
| 10,985,728 | B2 | 4/2021 | Plesski et al. |
| 10,998,882 | B2 | 5/2021 | Yantchev et al. |
| 11,146,232 | B2 | 10/2021 | Yandrapalli et al. |
| 11,201,601 | B2 | 12/2021 | Yantchev et al. |
| 11,374,549 | B2 * | 6/2022 | Yantchev ................. H03H 3/04 |
| 11,418,167 | B2 | 8/2022 | Garcia |
| 2002/0079986 | A1 | 6/2002 | Ruby et al. |
| 2004/0041496 | A1 | 3/2004 | Imai et al. |
| 2005/0099091 | A1 | 5/2005 | Mishima et al. |
| 2007/0188047 | A1 | 8/2007 | Tanaka |
| 2007/0278898 | A1 | 12/2007 | Miura et al. |
| 2007/0296304 | A1 | 12/2007 | Fujii et al. |
| 2008/0074212 | A1 | 3/2008 | Matsuda |
| 2010/0223999 | A1 | 9/2010 | Onoe |
| 2010/0301703 | A1 | 12/2010 | Chen et al. |
| 2011/0102107 | A1 | 5/2011 | Onzuka |
| 2013/0057360 | A1 | 3/2013 | Meltaus et al. |
| 2013/0207747 | A1 | 8/2013 | Nishii et al. |
| 2013/0234805 | A1 | 9/2013 | Takahashi |
| 2013/0271238 | A1 | 10/2013 | Onda et al. |
| 2014/0009032 | A1 | 1/2014 | Takahashi et al. |
| 2014/0113571 | A1 | 4/2014 | Fujiwara et al. |
| 2014/0152145 | A1 | 6/2014 | Kando et al. |
| 2015/0244149 | A1 | 8/2015 | Van Someren |
| 2016/0079958 | A1 | 3/2016 | Burak |
| 2016/0149554 | A1 | 5/2016 | Nakagawa |
| 2016/0285430 | A1 | 9/2016 | Kikuchi et al. |
| 2017/0187352 | A1 | 6/2017 | Omura |
| 2017/0201232 | A1 | 7/2017 | Nakamura et al. |
| 2017/0214385 | A1 | 7/2017 | Bhattacharjee |
| 2017/0264266 | A1 | 9/2017 | Kishimoto |
| 2017/0290160 | A1 | 10/2017 | Takano et al. |
| 2018/0013400 | A1 | 1/2018 | Ito et al. |
| 2018/0013405 | A1 | 1/2018 | Takata |
| 2018/0152169 | A1 | 5/2018 | Goto et al. |
| 2018/0212589 | A1 | 7/2018 | Meltaus et al. |
| 2018/0262179 | A1 * | 9/2018 | Goto ................... H03H 9/14552 |
| 2018/0316333 | A1 | 11/2018 | Nakamura et al. |
| 2019/0007022 | A1 | 1/2019 | Goto et al. |
| 2019/0068155 | A1 | 2/2019 | Kimura et al. |
| 2019/0181833 | A1 | 6/2019 | Nosaka |
| 2019/0207583 | A1 | 7/2019 | Miura et al. |
| 2019/0245518 | A1 | 8/2019 | Ito |
| 2019/0341911 | A1 | 11/2019 | Komatsu et al. |
| 2019/0348966 | A1 | 11/2019 | Campanella-Pineda et al. |
| 2019/0386638 | A1 | 12/2019 | Kimura et al. |
| 2020/0021272 | A1 | 1/2020 | Segovia Fernandez et al. |
| 2020/0083861 | A1 * | 3/2020 | Matsuo ..................... H03H 3/02 |
| 2020/0228087 | A1 | 7/2020 | Michigami et al. |
| 2020/0244247 | A1 | 7/2020 | Maeda |
| 2020/0295729 | A1 | 9/2020 | Yantchev |
| 2020/0304091 | A1 | 9/2020 | Yantchev |
| 2020/0321939 | A1 | 10/2020 | Turner et al. |
| 2020/0328728 | A1 | 10/2020 | Nakagawa et al. |
| 2021/0152154 | A1 * | 5/2021 | Tang ................... H03H 9/02858 |
| 2021/0273631 | A1 * | 9/2021 | Jachowski ............. H03H 9/132 |
| 2021/0313951 | A1 | 10/2021 | Yandrapalli et al. |
| 2021/0328575 | A1 | 10/2021 | Hammond et al. |
| 2022/0103160 | A1 | 3/2022 | Jachowski et al. |
| 2022/0116015 | A1 | 4/2022 | Garcia et al. |
| 2022/0123720 | A1 | 4/2022 | Garcia et al. |
| 2022/0123723 | A1 | 4/2022 | Garcia et al. |
| 2022/0149808 | A1 | 5/2022 | Dyer et al. |
| 2022/0149814 | A1 | 5/2022 | Garcia et al. |

FOREIGN PATENT DOCUMENTS

| | | |
|---|---|---|
| JP | H06152299 A | 5/1994 |
| JP | 2002300003 A | 10/2002 |
| JP | 2004096677 A | 3/2004 |
| JP | 2007329584 A | 12/2007 |
| JP | 2008-079227 A | 4/2008 |
| JP | 2010062816 A | 3/2010 |
| JP | 2010-233210 A | 10/2010 |
| JP | 2012049758 A | 3/2012 |
| JP | 2012-169760 A | 9/2012 |
| JP | 2013-528996 A | 7/2013 |
| JP | 2013214954 A | 10/2013 |
| JP | 2018093487 A | 6/2018 |
| JP | 2018166259 A | 10/2018 |
| JP | 2018207144 A | 12/2018 |
| JP | 2020113939 A | 7/2020 |
| WO | 2013128636 A1 | 9/2013 |
| WO | 2015098694 A1 | 7/2015 |
| WO | 2016017104 A1 | 2/2016 |
| WO | 2016052129 A1 | 4/2016 |
| WO | 2016/147687 A1 | 9/2016 |
| WO | 2017188342 A1 | 11/2017 |
| WO | 2018163860 A1 | 9/2018 |
| WO | 2019138810 A1 | 7/2019 |
| WO | 2020100744 A1 | 5/2020 |

OTHER PUBLICATIONS

Lam et al., "A Review of Lame and Lamb Mode Crystal Resonators for Timing Applications and Prospects of Lame and Lamb Mode Piezo MEMS Resonators for Filtering Applications," 2018 Interna-

(56) References Cited

OTHER PUBLICATIONS tional Symposium on Acoustic Wave Devices for Future Mobile Communication Systems, Mar. 6-7, 2018, 12 pages.

* cited by examiner

FILTER USING TRANSVERSELY-EXCITED FILM BULK ACOUSTIC RESONATORS WITH DIVIDED FREQUENCY-SETTING DIELECTRIC LAYERS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent is a continuation of application Ser. No. 17/081,717, entitled FILTER USING TRANSVERSELY-EXCITED FILM BULK ACOUSTIC RESONATORS WITH DIVIDED FREQUENCY-SETTING DIELECTRIC LAYERS, filed Oct. 27, 2020 which claims priority from provisional patent application 63/067,329, filed Aug. 19, 2020, entitled BACKSIDE DIELECTRIC FOR A2 SPUR MITIGATION IN XBAR RESONATORS. Application Ser. No. 17/081,717 is a continuation-in-part of application Ser. No. 16/920,173, entitled TRANSVERSELY-EXCITED FILM BULK ACOUSTIC RESONATOR, filed Jul. 2, 2020, which is a continuation of application Ser. No. 16/438,121, entitled TRANSVERSELY-EXCITED FILM BULK ACOUSTIC RESONATOR, filed Jun. 11, 2019, now U.S. Pat. No. 10,756,697, which is a continuation-in-part of application Ser. No. 16/230,443, entitled TRANSVERSELY-EXCITED FILM BULK ACOUSTIC RESONATOR, filed Dec. 21, 2018, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All these applications are incorporated herein by reference.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are N77, which uses the frequency range from 3300 MHz to 4200 MHz, and N79, which uses the frequency range from 4400 MHz to 5000 MHz. Both band N77 and band N79 use time-division duplexing (TDD), such that a communications device operating in band N77 and/or band N79 use the same frequencies for both uplink and downlink transmissions. Bandpass filters for bands N77 and N79 must be capable of handling the transmit power of the communications device. The 5G NR standard also defines millimeter wave communication bands with frequencies between 24.25 GHz and 40 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
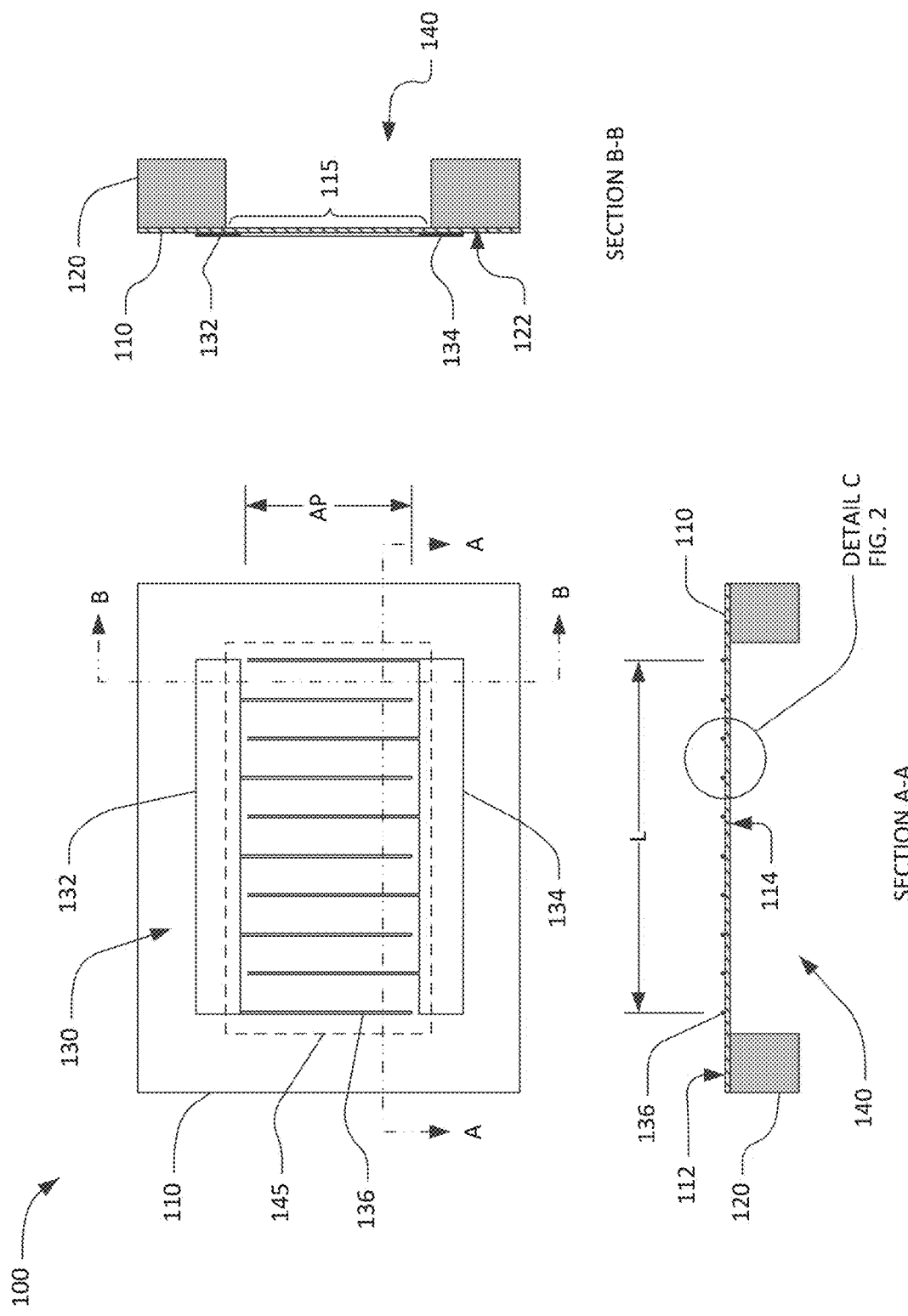
FIG. 1 is a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front surface 112 and back surface 114. However, XBARs may be fabricated on piezoelectric plates with other crystallographic orientations including rotated Z-cut and rotated YX-cut.

The back surface 114 of the piezoelectric plate 110 is attached to a surface 122 of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have hundreds, possibly thousands, of parallel fingers in the IDT 110. Similarly, the thickness of the fingers in the cross-sectional views is greatly exaggerated in the drawings.

Figure 2:
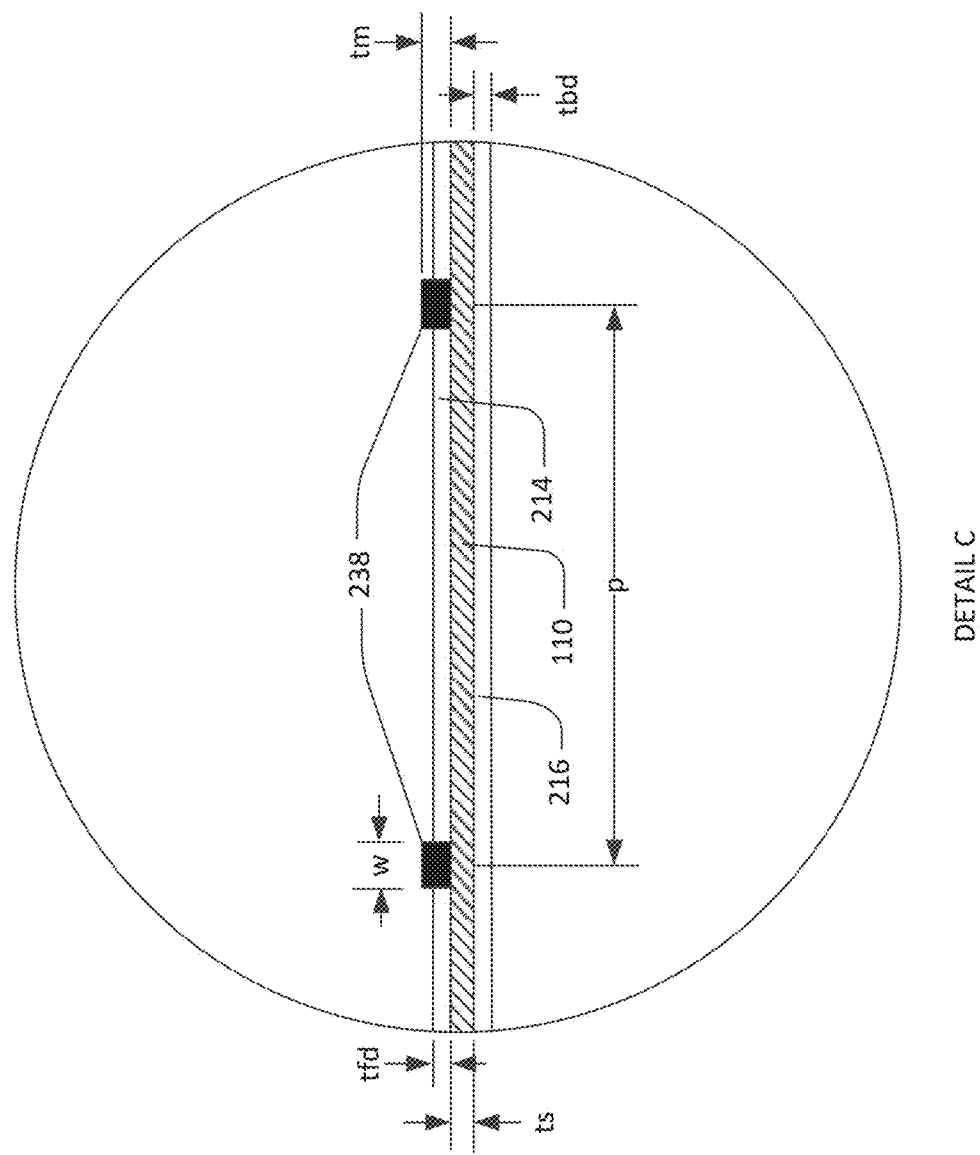
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezo-electric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum, a substantially aluminum alloy, copper, a substantially copper alloy, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 2, the IDT fingers 238 have rectangular cross-sections. The IDT fingers may have some other cross-sectional shape, such as trapezoidal.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
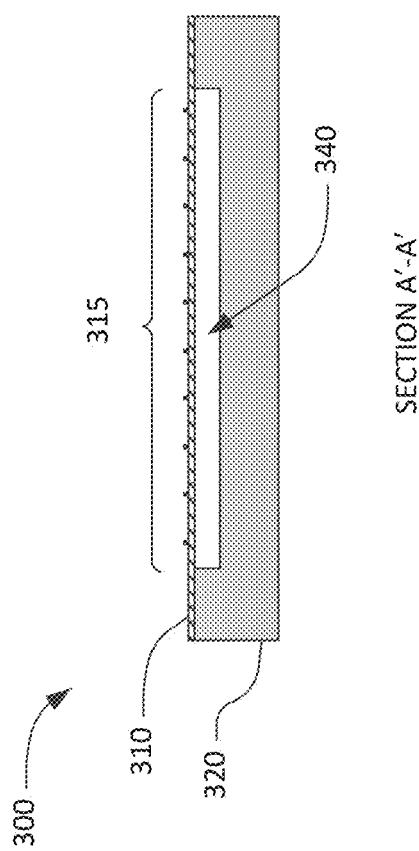
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Figure 4:
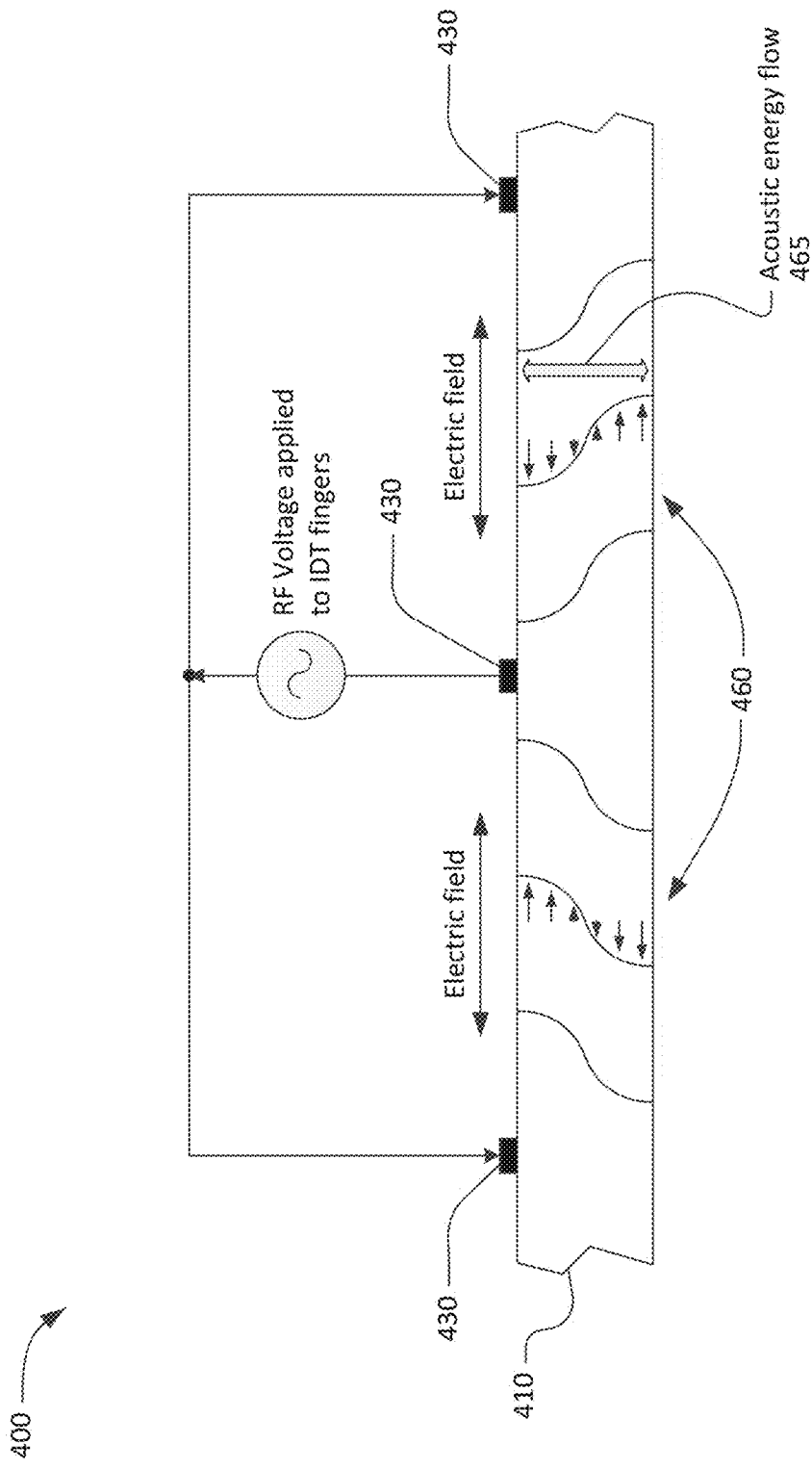
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
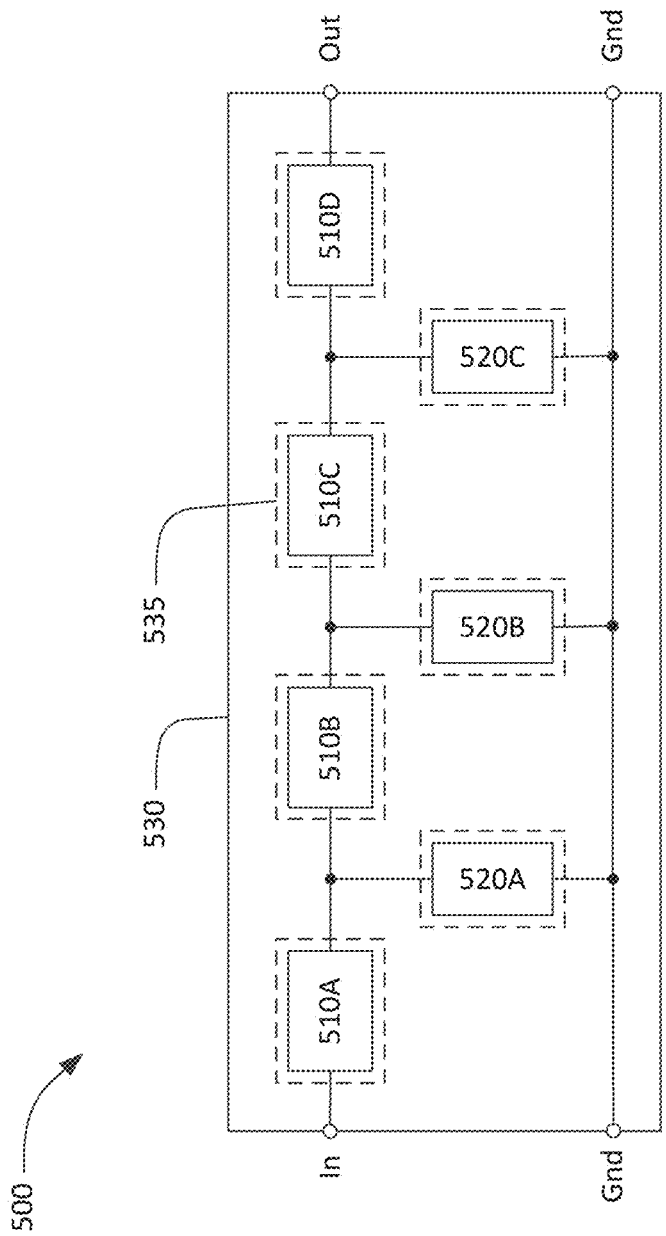
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including four series resonators 510A, 510B, 510C, 510D and three shunt resonators 520A, 520B, 520C. The four series resonators 510A, 510B, 510C, and 510D are connected in series between a first port and a second port (hence the term "series resonator"). In FIG. 5, the first and second ports are labeled "In" and "Out", respectively. However, the filter 500 is bidirectional and either port may serve as the input or output of the filter. The three shunt resonators 520A, 520B, 520C are connected from nodes between the series resonators to ground. A filter may contain additional reactive components, such as inductors, not shown in FIG. 5. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 500, the four series resonators 510A, B, C, D and the three shunt resonators 520A, B, C of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 510D, 520A, 520B, 520C in the filter 500 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Figure 6:
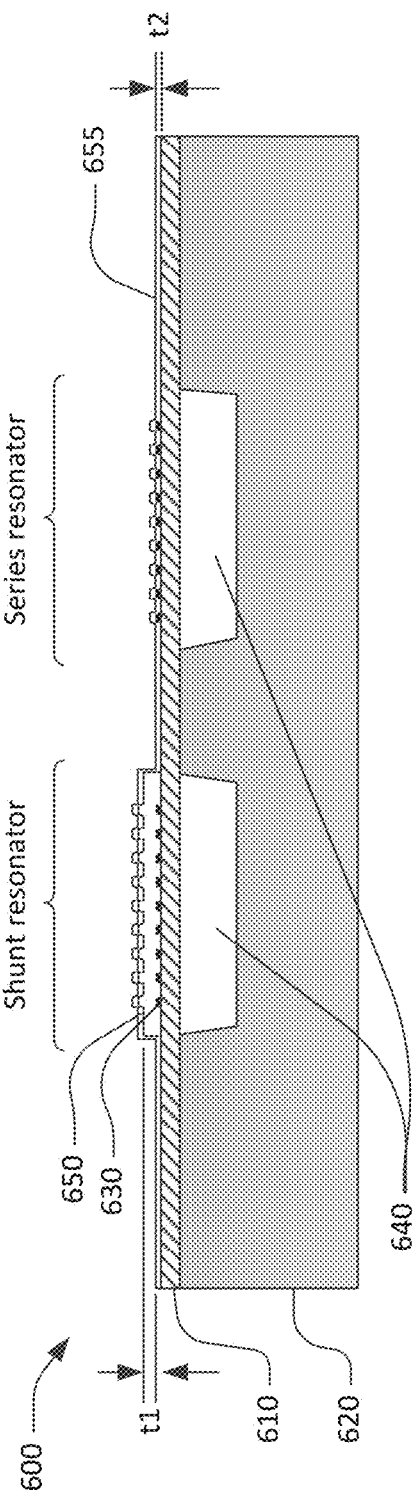
FIG. 6 is a schematic cross-sectional view of two XBARs illustrating a frequency-setting dielectric layer.

FIG. 6 is a schematic cross-sectional view through a shunt resonator and a series resonator of a filter 600 that uses a dielectric frequency setting layer to separate the resonance frequencies of shunt and series resonators. A piezoelectric plate 610 is attached to a substrate 620. Portions of the piezoelectric plate 610 form diaphragms spanning cavities 640 in the substrate 620. Interleaved IDT fingers, such as finger 630, are formed on the diaphragms. A first dielectric layer 650, having a thickness t1, is formed over the IDT of the shunt resonator. The first dielectric layer 650 is considered a "frequency setting layer", which is a layer of dielectric material applied to a first subset of the resonators in a filter to offset the resonance frequencies of the first subset of resonators with respect to the resonance frequencies of resonators that do not receive the dielectric frequency setting layer. The dielectric frequency setting layer is commonly silicon dioxide, but may be silicon nitride, aluminum oxide, aluminum nitride, beryllium oxide, tantalum oxide, tungsten oxide, or some other dielectric material. The dielectric frequency setting layer may be a laminate or composite of two or more dielectric materials.

A second dielectric layer 655, having a thickness t2, may be deposited over both the shunt and series resonator. The second dielectric layer 655 serves to seal and passivate the surface of the filter 600. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 600. Thus, the second dielectric layer can be referred to as the "passivation and tuning layer".

The resonance frequency of an XBAR is roughly proportional to the inverse of the total thickness of the diaphragm including the piezoelectric plate 610 and the dielectric layers 650, 655. The diaphragm of the shunt resonator is thicker than the diaphragm of the series resonator by the thickness t1 of the dielectric frequency setting layer 650. Thus, the shunt resonator will have a lower resonance frequency than the series resonator. The difference in resonance frequency between series and shunt resonators is determined by the thickness t1.

Figure 7:
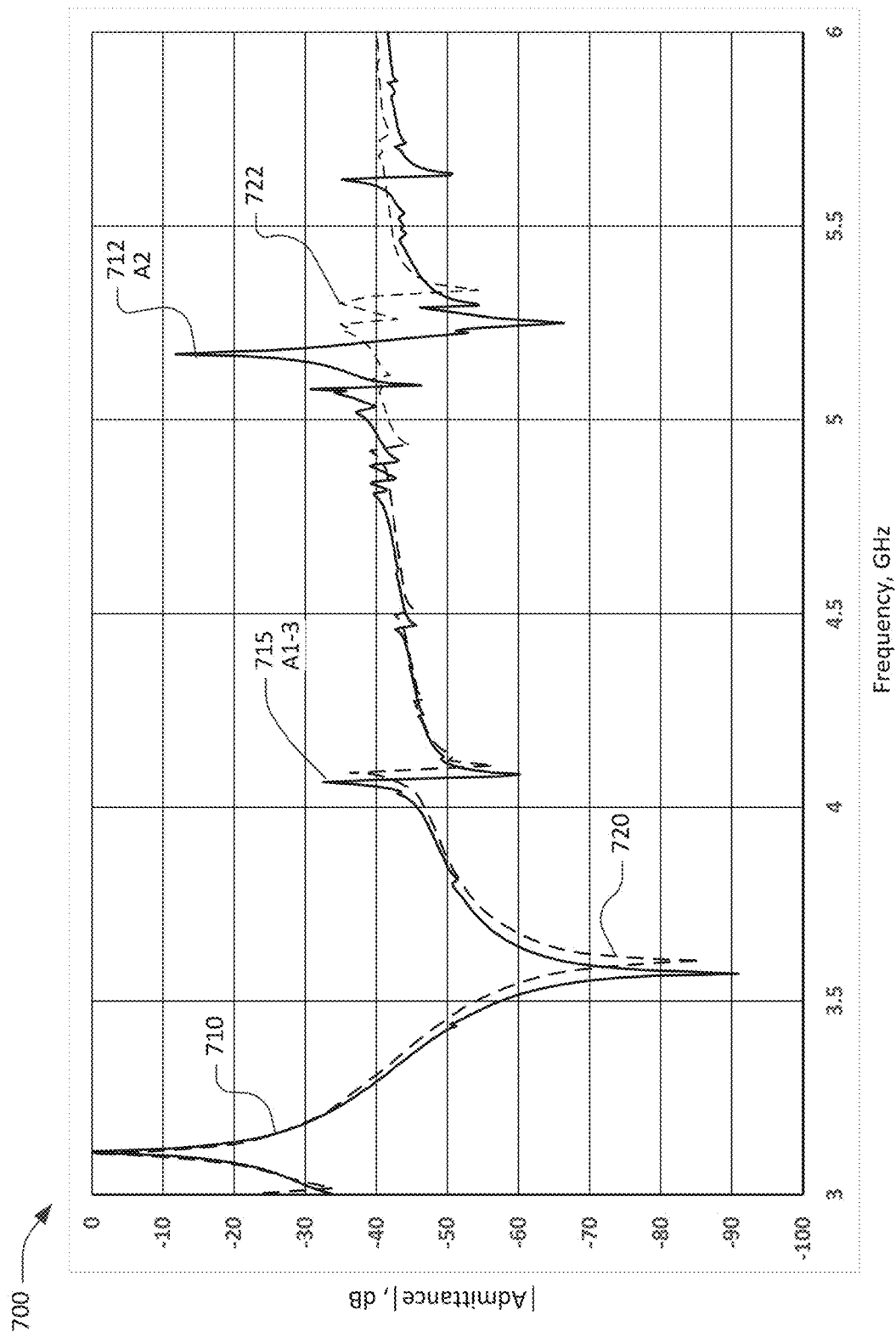
FIG. 7 is a graph of the admittance of an XBAR with a thick frequency-setting dielectric layer.

XBAR bandpass filters for wide communications bands, such as band N77, require a thick dielectric tuning layer on shunt resonators to establish sufficient frequency separation between shunt and series resonators. When a single top-side dielectric tuning layer, as shown in FIG. 6, is used, the resulting asymmetric structure allow efficient excitation of spurious modes. FIG. 7 is a graph of the performance of two XBAR with thick dielectric tuning layers. FIG. 7 and subsequent figures are based on simulations of XBARs using a finite element method. Specifically, the solid curve 710 is a plot of the magnitude of admittance of a first XBAR as a function of frequency. The first XBAR has a lithium niobate piezoelectric plate 500 nm thick and a top-side $SiO_2$ tuning layer 180 nm thick, or 35% of the thickness of the piezoelectric plate. The IDT fingers are 560 nm of aluminum over 50 nm of titanium. The sidewall angle of the IDT fingers is 77 degrees. The IDT pitch is 5.5 µm and the mark or finger width is 1.2 µm.

The resonance and anti-resonance frequencies of the first XBAR are 3.11 and 3.5 GHz, respectively. An A1-3 spurious mode 715 occurs at about 4.1 GHz and an A2 spurious mode 712 occurs at 5.17 GHz. "A1-3" and "A2" refer to Lamb plate wave modes. The strong excitation of the A2 mode is due in part to the asymmetric structure of the XBAR.

In FIG. 7. the dashed curve 720 is a plot of the magnitude of admittance of a second XBAR as a function of frequency. The first XBAR has a lithium niobate piezoelectric plate 530 nm thick and a top-side $SiO_2$ tuning layer 150 nm thick, or 28% of the thickness of the piezoelectric plate. The IDT fingers are 560 nm of aluminum over 50 nm of titanium. The sidewall angle of the IDT fingers is 77 degrees. The IDT pitch is 5.5 µm and the mark or finger width is 1.2 µm.

The resonance frequencies of the first and second XBARs are the same. The anti-resonance frequency of the second XBAR (dashed curve 720) is higher than that of the first XBAR (solid curve 710), indicating slightly higher electromechanical coupling. A major different between the two curves is the substantial reduction in the A2 mode 722 of the second XBAR compared to the A2 mode 712 of the first XBAR. In general, the A2 mode is negligible when the thickness of the dielectric tuning layer is less than or equal to 0.25 times the thickness of the piezoelectric plate. Depending on filter requirements, the A2 mode may not be a problem when the thickness of the dielectric tuning layer is as large as 0.28 times the thickness of the piezoelectric plate.

Figure 8:
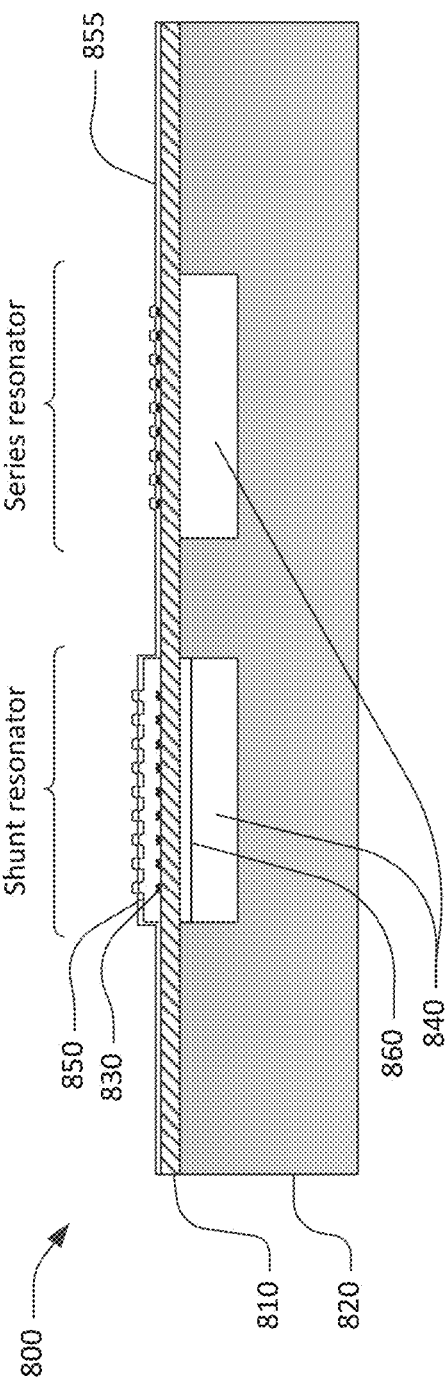
FIG. 8 is a schematic cross-sectional view of two XBARs illustrating divided frequency-setting dielectric layers.

FIG. 8 is a schematic cross-sectional view through a shunt resonator and a series resonator of a filter 800 that uses a divided dielectric frequency setting layer to separate the resonance frequencies of shunt and series resonators. A "divided frequency setting layer" divides the frequency setting function between a top-side dielectric layer and a back-side dielectric layer. A piezoelectric plate 810 is attached to a substrate 820. Portions of the piezoelectric plate 810 form diaphragms spanning cavities 840 in the substrate 820. Interleaved IDT fingers, such as finger 830, are formed on the diaphragms. A top-side dielectric frequency setting layer 850 is formed over the IDT of the shunt resonator. A bottom-side dielectric frequency setting layer 860 is formed on the back side of the diaphragm of the shunt resonator. The top-side frequency setting layer 850 and the bottom-side frequency setting layer 860 are collective considered a "divided frequency setting layer". The top-side frequency setting layer 850 and the bottom-side frequency setting layer 860 collectively determine the frequency difference between the shunt resonator and the series resonator of the filter 800. The top-side and bottom-side frequency setting layers are commonly $SiO_2$ but be any of the previously identified dielectric materials. The top-side and bottom-side frequency setting layers may be different materials and either or both may be a laminate or composite of two or more dielectric materials.

A passivation and tuning layer 855 may be deposited over both the shunt and series resonator as previously described.

In some applications, such as filters that require a broad stop-band above and/or below the filter passband, the required range of resonant frequencies for shunt resonators and/or series resonators may exceed the range that can be achieved using only IDT pitch. In such cases, a second front-side frequency setting layer may be formed over some, but not all, of the shunt resonators and/or some, but not all, of the series resonators. The thickness of a second front-side frequency setting layer will typically be thinner than the thickness of the first front-side frequency setting layer. The second front-side frequency setting layer may be any of the previously identified dielectric materials.

The resonance frequency of an XBAR is roughly proportional to the inverse of the total thickness of the diaphragm including the piezoelectric plate 810 and the dielectric layers 850, 855, 860. The diaphragm of the shunt resonator is thicker than the diaphragm of the series resonator by the total thickness of the top-side and bottom-side frequency setting layers 850, 860. Thus, the shunt resonator will have a lower resonance frequency than the series resonator.

Figure 9:
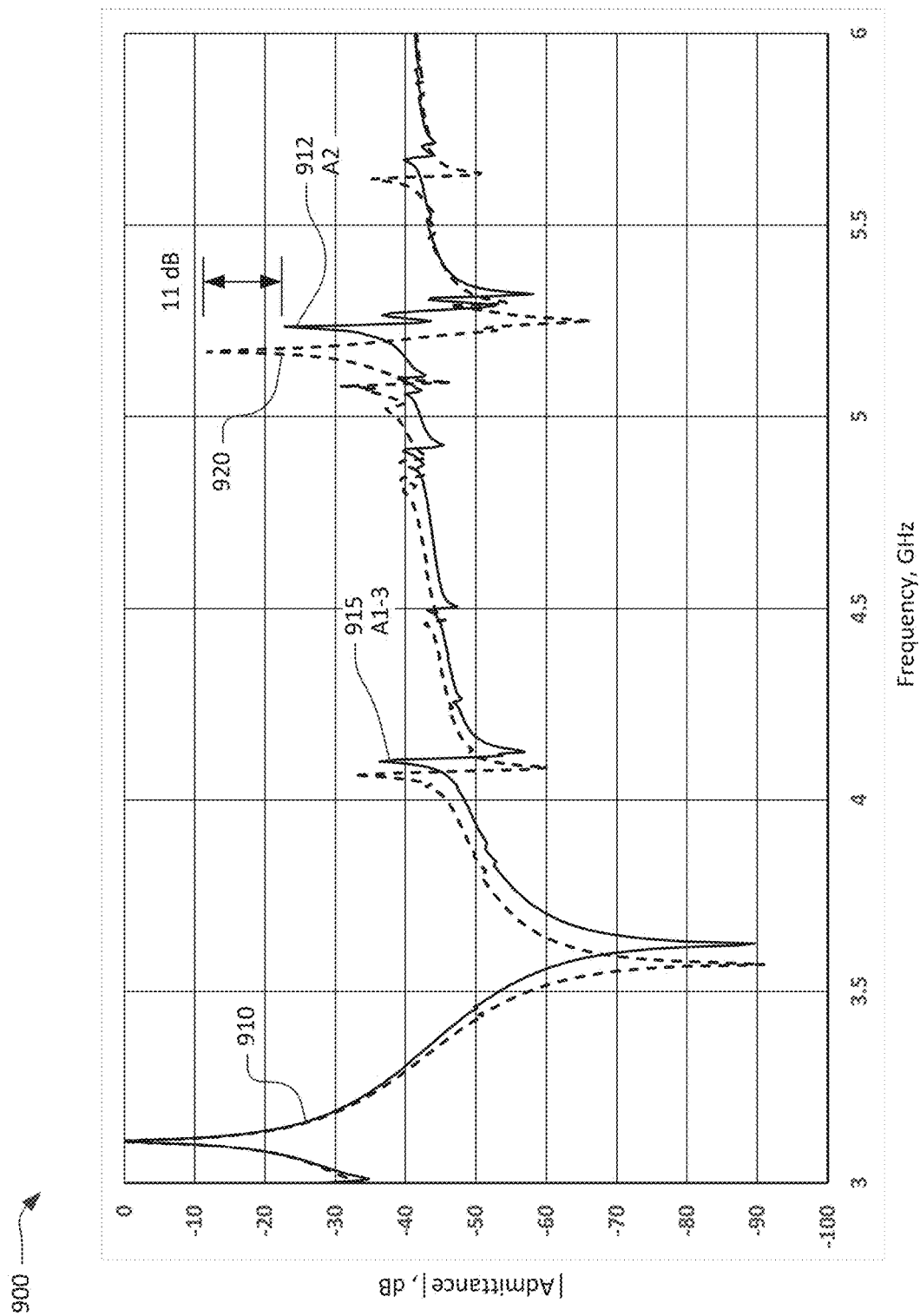
FIG. 9 is a graph of the admittance of an XBAR with a divided frequency-setting dielectric layer.

FIG. 9 is a graph 900 of the performance of an XBAR with a divided dielectric tuning layer. Specifically, the curve 910 is a plot of the magnitude of admittance of the XBAR as a function of frequency. The XBAR has the same construction as the described in conjunction FIG. 7 except for a divided frequency setting layer with 20% of the total thickness of the frequency setting layer on the back side of the diaphragm. The dashed curve 920 is a plot of the magnitude of admittance of the XBAR with a thick dielectric frequency setting layer, as previously shown in FIG. 7. The dashed curve 920 is provided for comparison.

The resonance and anti-resonance frequencies of the XBAR with the divided frequency setting layer are 3.11 and 3.625 GHz, respectively. An A1-3 spurious mode 915 occurs at about 4.1 GHz and an A2 spurious mode 912 occurs at 5.235 GHz. The peak magnitude of the admittance of the A2 mode is reduced by 11 dB. The difference between the anti-resonance and resonance frequencies of the XBAR with the divided frequency setting layer (solid line 910) is increased compared to the original XBAR (dashed line 920), indicating higher electromechanical coupling to the primary shear acoustic mode.

Figure 10:
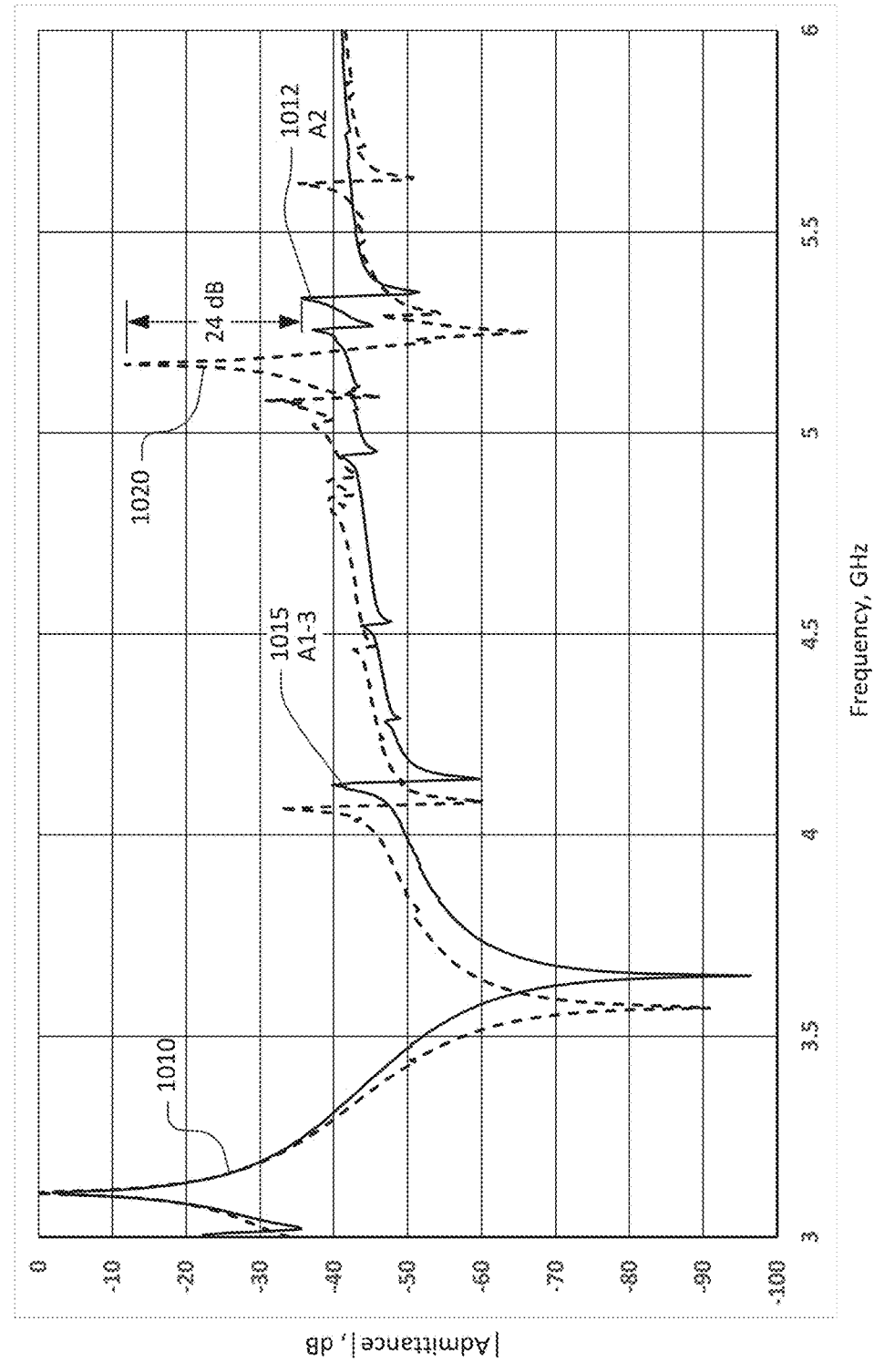
FIG. 10 is a graph of the admittance of another XBAR with a divided frequency-setting dielectric layer.

FIG. 10 is a graph 1000 of the performance of another XBAR with a divided dielectric tuning layer. Specifically, the curve 1010 is a plot of the magnitude of admittance of the XBAR as a function of frequency. The XBAR has the same construction as the described in conjunction FIG. 7 except for a divided frequency setting layer with 35% of the total thickness of the frequency setting layer on the back side of the diaphragm. The dashed curve 1020 is a plot of the magnitude of admittance of the XBAR with a thick dielectric frequency setting layer, as previously shown in FIG. 7. The dashed curve 1020 is provided for comparison.

The resonance and anti-resonance frequencies of the XBAR with the divided frequency setting layer are 3.11 and 3.65 GHz, respectively. An A1-3 spurious mode 1015 occurs at about 4.1 GHz and an A2 spurious mode 1012 occurs at 5.255 GHz. The peak magnitude of the admittance of the A2 mode is reduced by 24 dB. The difference between the anti-resonance and resonance frequencies of the XBAR with the divided frequency setting layer (solid line 1010) is increased compared to the original XBAR (dashed line 1020), indicating higher electromechanical coupling to the primary shear acoustic mode.

Figure 11:
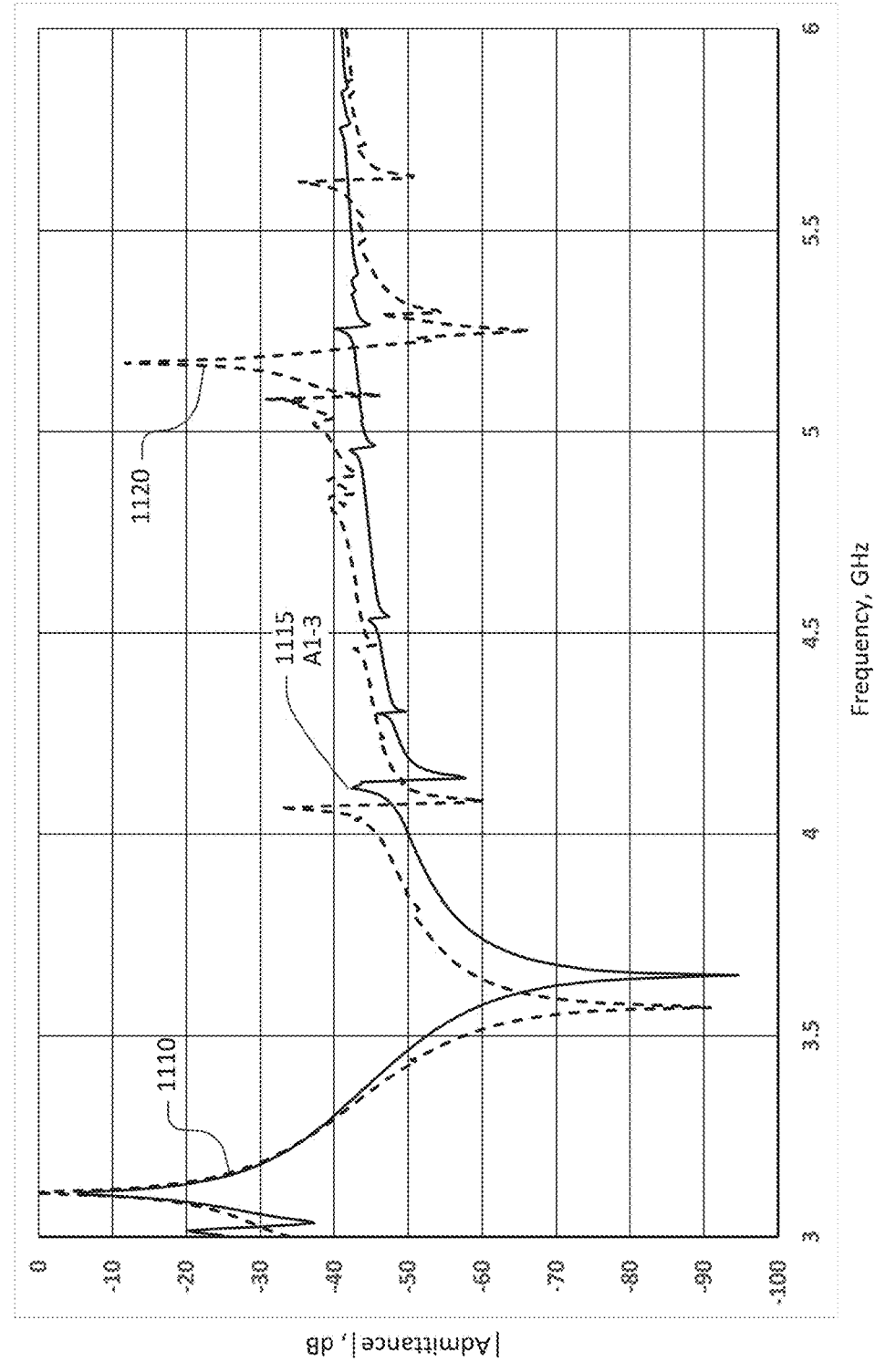
FIG. 11 is a graph of the admittance of another XBAR with a divided frequency-setting dielectric layer.

FIG. 11 is a graph 1100 of the performance of another XBAR with a divided dielectric tuning layer. Specifically, the curve 1110 is a plot of the magnitude of admittance of the XBAR as a function of frequency. The XBAR has the same construction as the described in conjunction FIG. 7 except for a divided frequency setting layer with 47% of the total thickness of the frequency setting layer on the back side of the diaphragm. The dashed curve 1120 is a plot of the magnitude of admittance of the XBAR with a thick dielectric frequency setting layer, as previously shown in FIG. 7. The dashed curve 1120 is provided for comparison.

The resonance and anti-resonance frequencies of the XBAR with the divided frequency setting layer are 3.11 and 3.65 GHz, respectively. An A1-3 spurious mode 1115 occurs at about 4.1 GHz. There is not an identifiable A2 spurious mode. The peak magnitude of the admittance of the A2 mode is reduced by 28 dB. The difference between the anti-resonance and resonance frequencies of the XBAR with the divided frequency setting layer (solid line 1110) is increased compared to the original XBAR (dashed line 1120), indicating higher electromechanical coupling to the primary shear acoustic mode.

Figure 12:
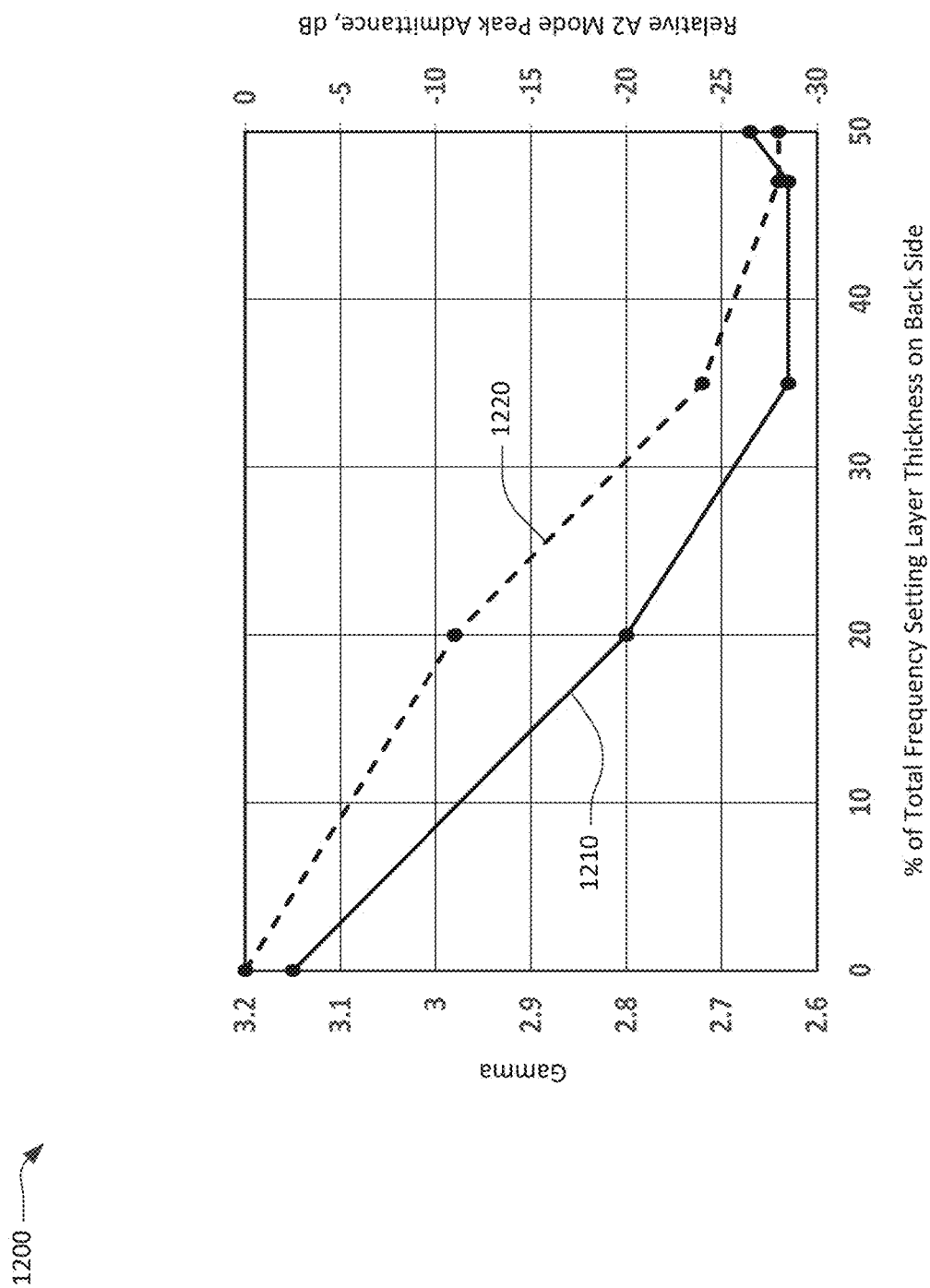
FIG. 12 is a graph of the effects of back-side frequency setting layer thickness on XBAR performance.

FIG. 12 is a graph 1200 of the effects of back-side frequency setting layer thickness on XBAR performance. In this example, the front-side and back-side frequency setting layers are $SiO_2$. Specifically, the solid curve 1210 is a plot of Gamma, a measure of electro-mechanical coupling of the shear primary acoustic mode, as a function of the thickness of the back-side frequency setting layer expressed as a percentage of the total frequency setting layer thickness. Gamma is lowest (i.e. highest coupling) when 35% to 50% of the total frequency setting layer thickness is on the back side of the diaphragm.

The dashed curve 1220 is a plot of peak admittance of the A2 spurious mode as a function of the thickness of the back-side frequency setting layer expressed as a percentage of the total frequency setting layer thickness. The peak admittance is expressed relative to the peak admittance of the A2 mode with a front-side frequency setting layer as shown in FIG. 7. The peak A2 mode admittance is reduced by at least 20 dB when the thickness of the back-side frequency setting layer is at least 30% of the total frequency setting layer thickness.

In the previous examples, both the front-side and back-side frequency setting layers were $SiO_2$. When a different dielectric material is used for both the front-side and back-side frequency setting layers, similar results can be expected. Gamma will decrease as the diaphragm structure becomes symmetrical and the A2 mode will be reduced by 20 dB or more when the thickness of the back-side frequency setting layer is at least 30% of the total frequency setting layer thickness.

When the back-side frequency setting layer and the front-side frequency setting layer are different materials, there will be some ratio of front-side thickness to back-side thickness that minimizes the peak admittance of the A2 spurious mode and also improves electromechanical coupling. The appropriate thickness ratio can be determined by simulation using the selected dielectric materials. In general, the thicknesses of the back-side frequency setting layer and the front-side frequency setting layer are configured so that a peak admittance of an A2 mode is substantially reduced compared to a peak admittance of an A2 spurious mode of a resonator with only a front-side frequency setting layer. In this context, "substantially reduced" means "reduced to a level where the A2 mode does not adversely affect filter performance."

Description of Methods

Figure 13:
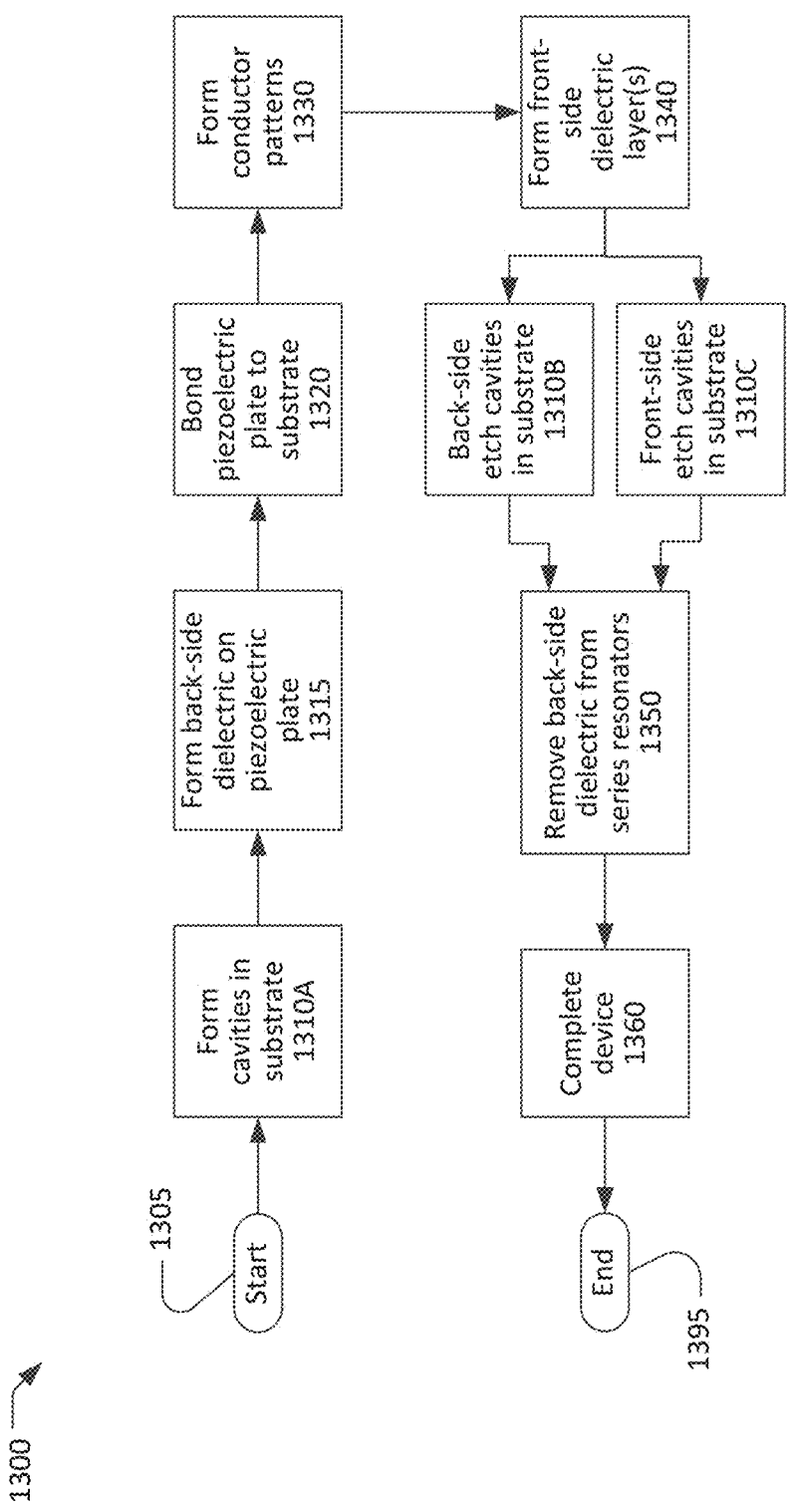
FIG. 13 is a flow chart of a process for fabricating XBARs.

FIG. 13 is a simplified flow chart showing a process 1300 for making a filter incorporating XBARs. The process 1300 starts at 1305 with a substrate and a plate of piezoelectric material and ends at 1395 with a completed filter. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

The flow chart of FIG. 13 captures three variations of the process 1300 for making an XBAR which differ in when and how cavities are formed in the substrate. The cavities may be formed at steps 1310A, 1310B, or 1310C. Only one of these steps is performed in each of the three variations of the process 1300.

The piezoelectric plate may be lithium niobate or lithium tantalate. The piezoelectric plate may be Z-cut, rotated Z-cut, or rotated YX-cut, or some other cut. The substrate may preferably be silicon. The substrate may be some other material that allows formation of deep cavities by etching or other processing.

In one variation of the process 1300, one or more cavities are formed in the substrate at 1310A, before the piezoelectric plate is bonded to the substrate at 1320. A separate cavity may be formed for each resonator in a filter device. The one or more cavities may be formed using conventional photolithographic and etching techniques. Typically, the cavities formed at 1310A will not penetrate through the substrate, and the resulting resonator devices will have a cross-section as shown in FIG. 3.

At 1315, a back side dielectric frequency setting layer is formed. The back-side frequency setting layer may be any of the dielectric material previously described. The back-side frequency setting layer may be formed by depositing the dielectric material on a surface of the substrate (e.g., the surface where the cavities were formed if action 1310A was performed) or a back surface of the piezoelectric plate or both.

At 1320, the piezoelectric plate is bonded to the substrate. The piezoelectric plate and the substrate may be bonded by a wafer bonding process. Typically, the mating surfaces of the substrate and the piezoelectric plate are highly polished. One or both of the mating surface will be covered by the dielectric back-side frequency setting layer formed at 1315. One or more additional layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1330 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1330 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1330 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1340, a front-side dielectric layer or frequency setting dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1300, one or more cavities are formed in the back side of the substrate at 1310B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 1300, one or more cavities in the form of recesses in the substrate may be formed at 1310C by etching the substrate using an etchant introduced through openings in the piezoelectric plate. A separate cavity may be formed for each resonator in a filter device. The one or more cavities formed at 1310C will not penetrate through the substrate, and the resulting resonator devices will have a cross-section as shown in FIG. 3.

In all variations of the process 1300, the back-side dielectric layer is removed from the series resonators at 1350. When the cavities were formed at 1310B using a back-side etch, the back-side dielectric layer may also be removed from the series resonators by etching from the back side of the substrate. When the cavities were formed at 1310C using a front-side etch, the back-side dielectric layer may be removed from the series resonators by an etchant introduced through the same openings used to etch the cavities. When the cavities were formed at 1310A, the back-side dielectric layer may be removed from the series resonators by an etchant introduced through the openings in the piezoelectric plate created specifically for this purpose.

The filter device is then completed at 1360. Actions that may occur at 1360 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1360 is to tune the resonant frequencies of the resonators within the device by adding or removing metal or dielectric material from the front side of the device. After the filter device is completed, the process ends at 1395.

It is claimed:

1. A filter device, comprising:
    a substrate;
    a piezoelectric plate having front and back surfaces, the back surface attached to a surface of the substrate via one or more intermediate layers; and
    a plurality of acoustic resonators including one or more shunt resonators and one or more series resonators, each of the plurality of acoustic resonators comprising:
        an interdigital transducer (IDT) on the front surface of the piezoelectric plate, interleaved IDT fingers of the IDT on a respective diaphragm of the piezoelectric plate that is over a respective cavity in the substrate; and
        a dielectric frequency setting layer comprising:
            a front-side frequency setting layer over the front surface of a respective diaphragm of at least one shunt resonator of the one or more shunt resonators, and
            a back-side frequency setting layer on the back surface of the respective diaphragm of the at least one shunt resonator,
            wherein a total thickness of the front-side frequency setting layer and the back-side frequency setting layer is greater than 25% of a thickness of the piezoelectric plate.

2. The filter device of claim 1, wherein the front-side frequency setting layer is also over the interleaved IDT fingers of the at least one shunt resonator.

3. The filter device of claim 1, wherein the respective thicknesses of the front-side frequency setting layer, the back-side frequency setting layer and the piezoelectric plate are measured in a direction orthogonal to the front and back surfaces of the piezoelectric plate.

4. The filter device of claim 2, wherein:
    the one or more shunt resonators comprise a first shunt resonator and a second shunt resonator, and
    a first thickness of the front-side frequency setting layer over the first shunt resonator and a second thickness of the front-side frequency setting layer over the second shunt resonator are different.

5. The filter device of claim 1, wherein the thickness of the back-side frequency setting layer is at least 30% of the total thickness of the front-side frequency setting layer and the back-side frequency setting layer.

6. The filter device of claim 5, wherein the thickness of the back-side frequency setting layer is greater than or equal to 35% of the total thickness of the front-side frequency setting layer and the back-side frequency setting layer and less than or equal to 50% of the total thickness of the front-side frequency setting layer and the back-side frequency setting layer.

7. The filter device of claim 1, wherein the front-side frequency setting layer and the back-side frequency setting layer each comprise at least one of silicon dioxide, silicon nitride, aluminum oxide, aluminum nitride, beryllium oxide, tantalum oxide, and tungsten oxide.

8. The filter device of claim 7, wherein the thickness of the front-side frequency setting layer and the thickness of the back-side frequency setting layer are configured such that a peak admittance of an A2 spurious mode is substantially reduced compared to a peak admittance of an A2 spurious mode of a resonator with only a front-side frequency setting layer.

9. The filter device of claim 1, further comprising a passivation and tuning layer that is disposed over all of the plurality of acoustic resonators.

10. A filter device, comprising:
    a substrate;
    a piezoelectric plate having front and back surfaces, the back surface attached to a surface of the substrate via one or more intermediate layers;
    a plurality of acoustic resonators connected in a ladder filter circuit, the plurality of acoustic resonators including one or more shunt resonators and one or more series resonators, each of the plurality of acoustic resonators comprising:
        an interdigital transducer (IDT) on the front surface of the piezoelectric plate and having interleaved IDT fingers on a respective diaphragm of the piezoelectric plate that is over a respective cavity in the substrate;
        a front-side frequency setting layer on the interleaved IDT fingers and the front surface of the respective diaphragm of at least one shunt resonator of the one or more shunt resonators; and
        a back-side frequency setting layer on the back surface of the respective diaphragm of the at least one shunt resonator,
        wherein a total thickness of the front-side frequency setting layer and the back-side frequency setting layer is greater than 25% of a thickness of the piezoelectric plate.

11. The filter device of claim 10, wherein the respective thicknesses of the front-side frequency setting layer, the back-side frequency setting layer and the piezoelectric plate are measured in a direction orthogonal to the front and back surfaces of the piezoelectric plate.

12. The filter device of claim 10, wherein the front-side frequency setting layer and the back-side frequency setting layer each comprise at least one of silicon dioxide, silicon nitride, aluminum oxide, aluminum nitride, beryllium oxide, tantalum oxide, and tungsten oxide.

13. The filter device of claim 10, wherein a thickness of the front-side frequency setting layer and a thickness of the back-side frequency setting layer are configured such that a peak admittance of an A2 spurious mode is substantially reduced compared to a peak admittance of an A2 spurious mode of a resonator without a back-side frequency setting layer.

14. The filter device of claim 10, wherein the thickness of the back-side frequency setting layer is at least 30% of the total thickness of the front-side frequency setting layer and the back-side frequency setting layer.

15. The filter device of claim 14, wherein the thickness of the back-side frequency setting layer is greater than or equal to 35% of the total thickness of the front-side frequency setting layer and the back-side frequency setting layer and less than or equal to 50% of the total thickness of the front-side frequency setting layer and the back-side frequency setting layer.

16. The filter device of claim 10, further comprising a passivation and tuning layer that is over all of the plurality of acoustic resonators.

17. The filter device of claim 10, further comprising an additional front-side frequency setting layer that is over the interleaved IDT fingers and the front surface of the respective diaphragm of another shunt resonator of the one or more shunt resonators.

* * * * *